(12) United States Patent
Wittmann-Todd et al.

(10) Patent No.: US 9,907,159 B2
(45) Date of Patent: Feb. 27, 2018

(54) PLUG CONNECTOR FOR TUNING CROSSTALK AND RETURN LOSS

(71) Applicant: Fluke Corporation, Everett, WA (US)

(72) Inventors: Paul Wittmann-Todd, Seattle, WA (US); Jeffrey S. Bottman, Seattle, WA (US); William F. Winston, Lake Stevens, WA (US)

(73) Assignee: Fluke Corporation, Everett, WA (US)

( * ) Notice: Subject to any disclaimer, the term of this patent is extended or adjusted under 35 U.S.C. 154(b) by 37 days.

(21) Appl. No.: 15/207,840

(22) Filed: Jul. 12, 2016

(65) Prior Publication Data

US 2018/0020539 A1    Jan. 18, 2018

(51) Int. Cl.
| | |
|---|---|
| *H03H 7/38* | (2006.01) |
| *H05K 1/02* | (2006.01) |
| *H01R 13/6466* | (2011.01) |
| *H01R 13/6473* | (2011.01) |
| *H03H 7/03* | (2006.01) |
| *H03H 7/01* | (2006.01) |

(52) U.S. Cl.
CPC ....... *H05K 1/0233* (2013.01); *H01R 13/6466* (2013.01); *H01R 13/6473* (2013.01); *H03H 7/0115* (2013.01); *H03H 7/03* (2013.01); *H03H 7/38* (2013.01); *H05K 1/0228* (2013.01); *H05K 1/0231* (2013.01); *H05K 2201/1003* (2013.01); *H05K 2201/10015* (2013.01)

(58) Field of Classification Search
CPC .......... H03H 7/38; H03H 7/03; H05K 1/0233; H05K 1/0231; H05K 1/0288
USPC ............... 333/134, 33; 324/628; 439/620.01, 439/620.09, 620.13, 620.14, 620.24
See application file for complete search history.

(56) References Cited

U.S. PATENT DOCUMENTS

| | | | |
|---|---|---|---|
| 7,317,318 B2 | 1/2008 | Jackson | |
| 2014/0302718 A1* | 10/2014 | Gailus | H01R 13/6608 439/620.21 |
| 2014/0342610 A1 | 11/2014 | Hasim | |
| 2016/0079710 A1 | 3/2016 | Schumacher | |

OTHER PUBLICATIONS

Extended European Search Report, dated Dec. 7, 2017, for European Application No. 17181014.6-1927, 8 pages.

\* cited by examiner

*Primary Examiner* — Stephen E Jones
(74) *Attorney, Agent, or Firm* — Seed IP Law Group LLP (57) ABSTRACT

A method and apparatus for tuning crosstalk and return loss are provided. In the method and apparatus, a filter tunes return loss caused by a first external terminal and a second external terminal to compensate for a capacitive load induced by sizes of and a proximity between the first and second external terminals. The filter decouples the tuning of the return loss from tuning a magnitude and a phase of a crosstalk between a first transmission line network and a second transmission line network such that the return loss is tuned with minimal impact on the crosstalk.

19 Claims, 4 Drawing Sheets

PLUG CONNECTOR FOR TUNING CROSSTALK AND RETURN LOSS

BACKGROUND

Technical Field

This application is directed to a plug connector for tuning crosstalk and return loss.

Description of the Related Art

A signal traversing a communication medium is often subject to electromagnetic interference from another signal traversing another communication medium within a proximity of the signal's communication medium. The electromagnetic interference induces crosstalk in the signal. The signal may also experience a loss of power caused by an impedance mismatch in the communication medium (known as return loss). The return loss is proportional to the impedance mismatch. For example, where there is a relatively large degree of impedance mismatch over the transmission medium from the source to the load, the reflected power of the signal is large relative to the incident power of the signal. Conversely, when the degree of impedance mismatch is relatively small, the reflected power of the signal is also small relative to its incident power.

BRIEF SUMMARY

In an embodiment, an apparatus includes a printed circuit board, a plurality of external terminals at a first end of the printed circuit board and a plurality of internal terminals at a second end of the printed circuit board. The printed circuit board includes a filter coupled to a first external terminal and a second second external terminal of the plurality of external terminals. The filter includes a first inductor coupled between the first external terminal and a first side of a capacitor, and a second inductor coupled between the second external terminal and a and a second side of the capacitor. The filter is operative to tune return loss caused caused by the first and second external terminals and help compensate for a capacitive load induced by sizes of and a proximity between the first and second external terminals.

In an embodiment, the printed circuit board includes a first transmission line network including a first transmission line and a second transmission line. The first transmission line is coupled between the first side of the capacitor and a first internal terminal and the second transmission line is coupled between the second side of the capacitor and a second internal terminal. Each of the first and second transmission lines are located on the printed circuit board within a distance of a second transmission line network to tune a magnitude of crosstalk between the first transmission line network and the second transmission line network to a desired range of crosstalk magnitudes. The first and second transmission lines are being located within the distance of the second transmission line network over respective first and second portions of their lengths to tune a phase of the crosstalk to be within a desired limit of crosstalk phase.

In an embodiment, the second transmission line network includes a third transmission line and a fourth transmission line, where the first transmission line runs on the printed circuit board over the respective first portion of its length within a first distance of the third transmission line and the second transmission line runs on the printed circuit board over the respective second portion of its length within a second distance of the fourth transmission line.

In an embodiment, the magnitude of crosstalk tuned by the first transmission line network and the second transmission line network is proportional to the distance of the first transmission line network to the second transmission line network.

In an embodiment, the first and second transmission lines are diverted diverted away from the second transmission line network subsequent to the respective respective first and second portions of the lengths of the first and second transmission lines to cease tuning the magnitude of the crosstalk and the phase of the crosstalk.

In an embodiment, the first inductor and second inductor are discrete inductors and the capacitor is a discrete capacitor. In an embodiment, the filter is operative to decouple tuning the return loss from tuning the magnitude of the crosstalk and the phase of the crosstalk such that the return loss is tuned with minimal impact on the magnitude of the crosstalk and the phase of the crosstalk.

In an embodiment, the filter is coupled within a distance of 2.5 millimeters (mm) to the first external terminal and the second external terminal. In an embodiment, the plurality of external terminals form a contact block operable to connect the apparatus to a jack, where the plurality of internal terminals are operable to connect the apparatus to a cable.

In an embodiment, an apparatus includes a plurality of external terminals, a plurality of internal terminals and a filter coupled to a first external terminal and a second external terminal of the plurality of external terminals. The filter includes a first inductor coupled between the first external terminal and a first side of a capacitor, and a second inductor coupled between the second external terminal and a second side of the capacitor. The filter being operative to tune return loss caused by the first and second external terminals and help compensate for a capacitive load induced by sizes of and a proximity between the first and second external terminals.

In an embodiment, a method includes tuning, by a filter, return loss caused by a first external terminal and a second external terminal to compensate for a capacitive load induced by sizes of and a proximity between the first and second external terminals. The filter is coupled to the first external terminal and the second external terminal. The filter includes a first inductor coupled between the first external terminal and a first side of a capacitor, and a second inductor coupled between the second external terminal and a second side of the capacitor.

In an embodiment, the method includes decoupling, using the filter, the tuning of the return loss from tuning a magnitude and a phase of a crosstalk between a first transmission line network and a second transmission line network such that the return loss is tuned with minimal impact on the crosstalk. The first transmission line network includes a first transmission line and a second transmission line, where the first transmission line is coupled between the first side of the capacitor and a first internal terminal and the second transmission line is coupled between the second side of the capacitor and a second internal terminal.

DETAILED DESCRIPTION

Figure 1:
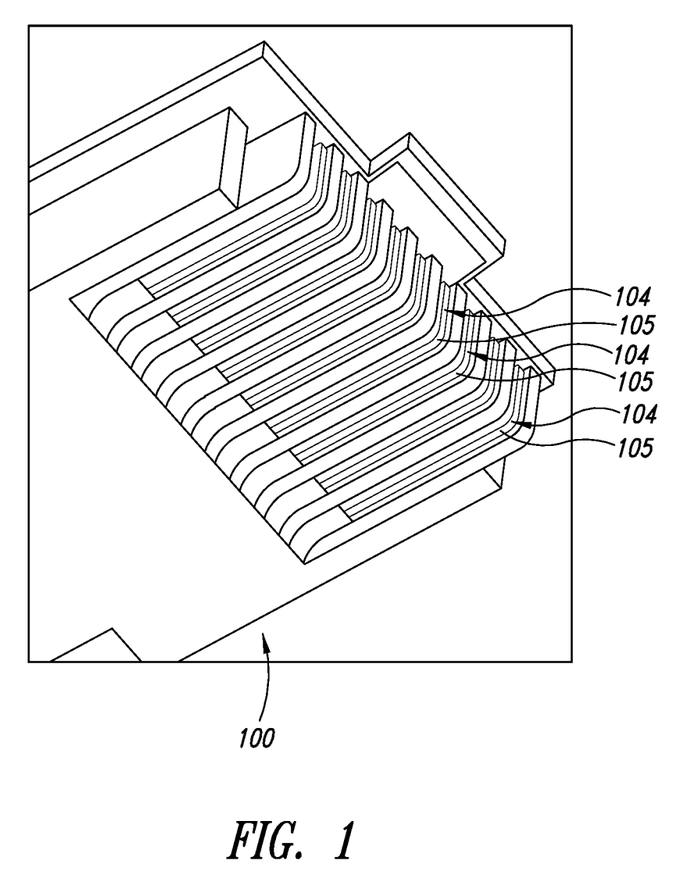
FIG. 1 shows a perspective view of a plug with a plurality of external terminals.

FIG. 1 shows a perspective view of a plug 100 with a plurality of external terminals 104. The plurality of external terminals 104 (singularly referred to herein as external terminal 104) are operable to be in contact with a corresponding plurality of terminals of another device (such as a jack (not shown)) to which the plug 100 is connected. Each external terminal comprises a blade 105 as shown in FIG. 1. The external terminal 104 may also comprise a conductive slot and a fusing alloy (not shown). The fusing alloy may be used to electrically couple the blade 105 to the conductive slot. Examples of the fusing alloy include solder. The plurality of external terminals 104 form a contact block used to electrically couple the plug 100 to the jack of the other device. Electrically coupling the plug 100 and a jack enables signal transmission through the plurality of external terminals 104.

Practically, it is advantageous for the plurality of external terminals 104 to be durably constructed to endure and resist wear and decay resulting from decoupling and recoupling the plug 100 to the jack many times during use. Thus, the plurality of external terminals 104 may have a size profile that is comparatively large in order to withstand wear resulting from repeated use. For example, an external terminal 104 may be made from an electrically-conductive material, such as copper. The external terminal 104 may, for example, be a slice of copper formed into a profile of a boot.

The size and proximity of the plurality of external terminals 104 creates a capacitive load between various pairs of external terminals 104 (such as pairs of adjacent external terminals 104). As such, each external terminal 104 of a pair of external terminals 104 functions as an electrically conductive plate of the capacitive load. The spacing between the pair of external terminals 104 functions as an insulating dielectric of the capacitive load. The capacitive load affects a signal traversing either external terminal 104 of the pair. The presence of the capacitive load across the pair of external terminals 104 (and more generally the transmission path of a signal) induces return loss in the signal path. The resulting return loss is tuned and mitigated as described herein.

Figure 2A:
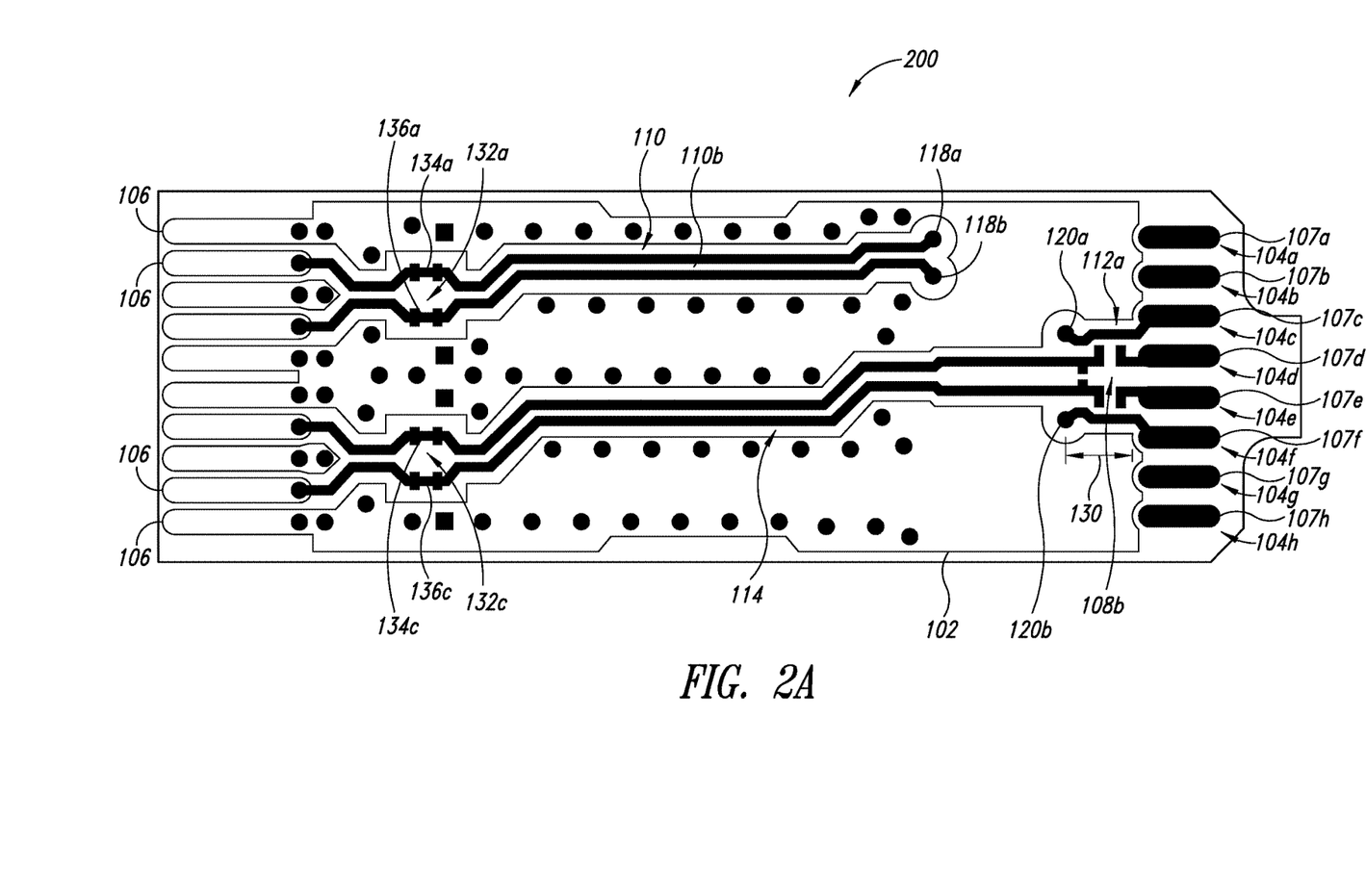
FIG. 2A shows a top view of a printed circuit board layout of the plug.
Figure 2B:
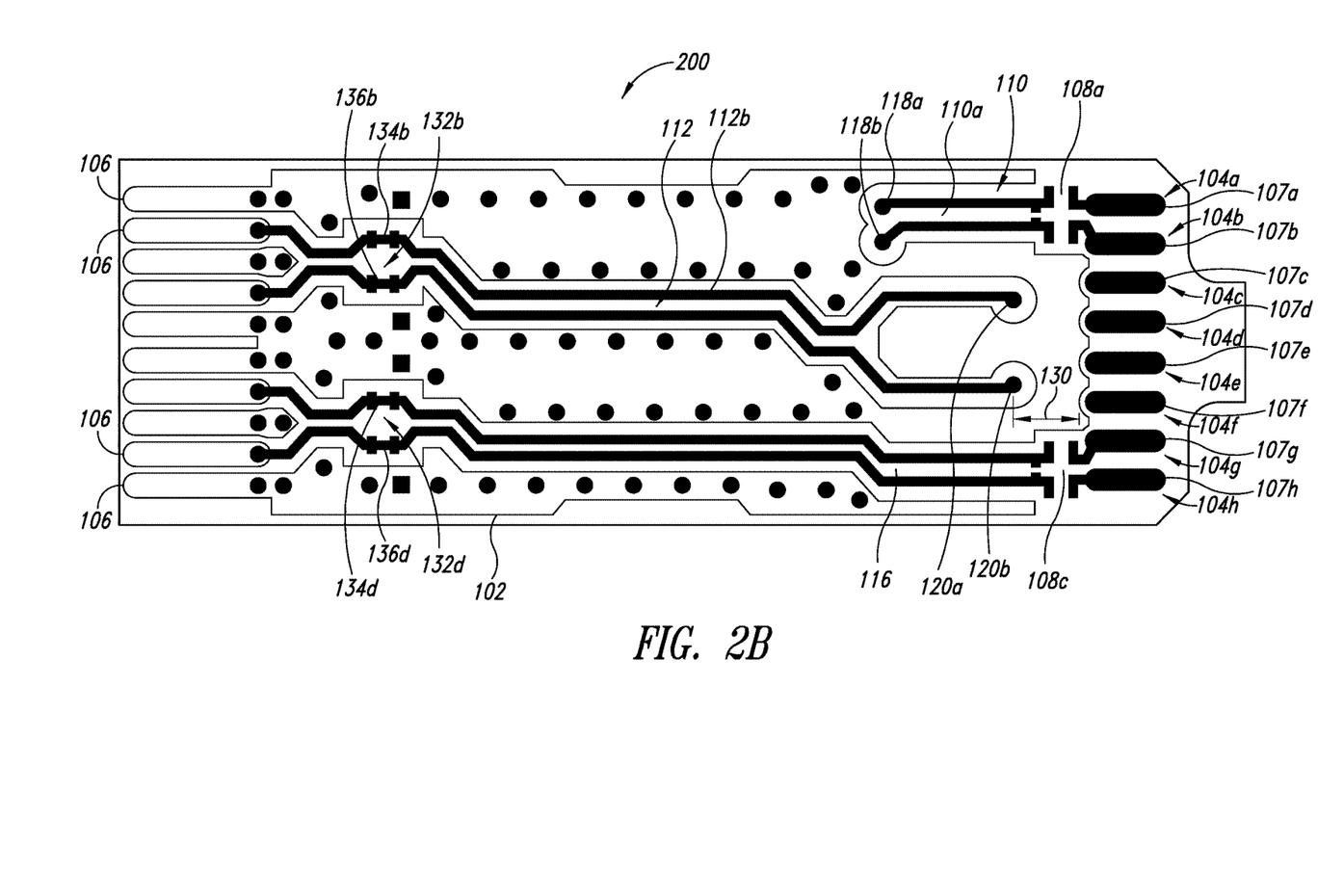
FIG. 2B shows a bottom view of the printed circuit board layout of the plug.

FIGS. 2A and 2B show top and bottom views of printed circuit board layouts of the plug 100, respectively. The plug 100 comprises a printed circuit board 102, a plurality of slots 107a-h (singularly referred to herein as slot 107) and a plurality of internal terminals 106. Each slot 107 of the plurality of slots 107a-h is part of a corresponding external terminal 104 of a plurality of external terminals 104a-h. As described with reference to FIG. 1 herein, the blade 105 may be soldered on the slot 107. The blade 105, slot 107 and the solder (not shown) together form an external terminal 104. The plurality of external terminals 104a-h form a contact block that is operable to connect the plug 100 to a jack. The plurality of internal terminals 106 may be operable to connect the plug 100 to a cable.

The plurality of external terminals 104 are shown in FIGS. 2A and 2B to include eight external terminals 104a-h (that are referred to herein as first external terminal 104a, second external terminal 104b and so on). The printed circuit board includes a plurality of filters 108a-c (referred to herein as first filter 108a, second filter 108b and third filter 108c) and a plurality of transmission line networks 110-116 (referred to herein as first transmission line network 110, second transmission line network 112, third transmission line network 114 and fourth transmission line network 116).

The first transmission line network 110 comprises a first portion 110a (in FIG. 2B) and a second portion 110b (in FIG. 2A). Similarly, the second transmission line network 112 comprises a first portion 112a (in FIG. 2A) and a second portion 112b (in FIG. 2B). The first and second portions 110a, 110b of the first transmission line network 110 are electrically coupled to one another by a pair of vertical interconnect accesses (vias) 118a, 118b. Further, the first and second portions 112a, 112b of the second transmission line network 112 are electrically coupled to one another by another pair of vias 120a, 120b. Electrically coupling elements as used herein is intended to signify connecting the elements such that electrical current may flow from one element to another.

As shown in FIG. 2B, the first filter 108a is coupled between the first and second external terminals 104a, 104b and the first portion 110a of the first transmission line network 110. In FIG. 2A, the second portion 110b of the first transmission line network 110 is coupled to a pair of internal terminals 106.

As shown in FIG. 2A, the second filter 108b is coupled between the fourth and fifth external terminals 104d, 104e and a first side of the third transmission line network 114. A second side of the third transmission line network 114 is coupled to a pair of internal terminals 106.

The first portion 112a of the second transmission line network 112 is coupled on one side to the third and sixth terminals 104c, 104f. The vias 120a, 120b electrically couple the first and second portions 112a, 112b of the second transmission line network 112 to one another. Another side of the second portion 112b of the second transmission line network 112 is coupled to a pair of internal terminals 106. The internal terminals 106 may be coupled to a cable.

As shown in FIG. 2B, the third filter 108c is coupled between the seventh and eighth external terminals 104g, 104h and a first side of the fourth transmission line network 116. A second side of the fourth transmission line network 116 is coupled to a pair of internal terminals 106.

Each pair of external terminals 104 (such as the first and second external terminals 104a, 104b, the third and sixth external terminals 104c, 104f, the fourth and fifth external terminals 104d, 104e and the seventh and eighth external terminals 104g, 104h) may be used to transmit a signal differentially. In differential signaling, a first transmission medium (for example, a wire or a transmission line) carries a signal, while a second transmission medium (for example, another wire or transmission line) carries a complementary signal that is offset by a phase from the signal carried by the first terminal transmission medium. The offset may be a half cycle length (or 180°). For example, the signal traversing the second terminal of the pair may be delayed by a half cycle length in relation to the signal traversing the first terminal.

The third and sixth external terminals 104c, 104f in operation may carry a differential signal. Furthermore, the fourth and fifth external terminals 104d, 104e may also carry a differential signal. The third and sixth external terminals 104c, 104f are referred to "split terminals" or "split pairs." That is due to the fact that they carry the differential signal but they are not adjacent to one another (i.e., there are one or more intervening external terminals therebetween). Conversely, the fourth and fifth external terminals 104d, 104e are not "split terminals" or "split pairs" because they are adjacent.

As a distance between a pair of terminals gets smaller so does the capacitive load induced by the pair of terminals and vice-versa. The increased distance between the third and sixth external terminals 104c, 104f results in a lower capacitance between the third and sixth external terminals 104c, 104f. Accordingly, the return loss affecting the differential signal carried by the third and sixth external terminals 104c, 104f is not as significant as that experienced by the other pairs of terminals (such as the first and second terminals 104a, 104b that are spatially closer to one another). As a result, a filter is not used to tune the return loss affecting the differential signal carried by the third and sixth external terminals 104c, 104f. However, the signals carried by the first and second external terminals 104a, 104b, the fourth and fifth external terminals 104d, 104e and the seventh and eighth external terminals 104g, 104h are tuned for return loss by the first, second and third filters 108a, 108b, 108c, respectively.

The first, second and third filters 108a, 108b, 108c may be π-filters, each comprising two inductors and a capacitor as described with reference to FIG. 3.

Figure 3:
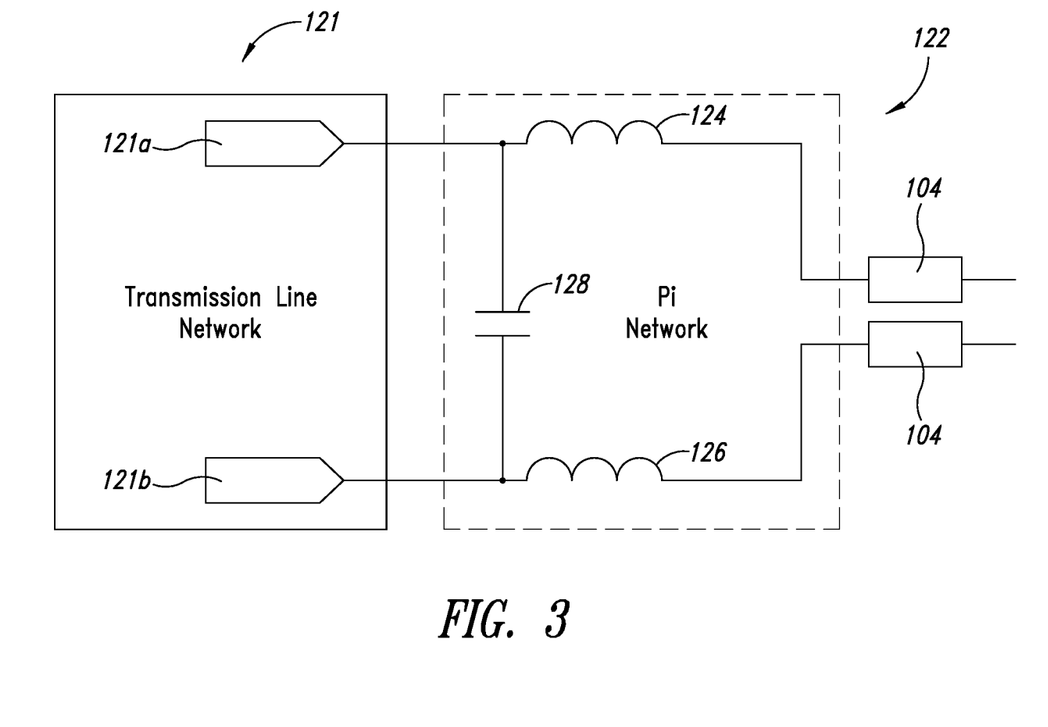
FIG. 3 shows a schematic of a π-filter coupled between two external terminals and a transmission line network.

FIG. 3 shows a schematic of a π-filter coupled between two external terminals 104 and a transmission line network 121. The transmission line network 121 is shown to include a first transmission line 121a and a second transmission line 121b. The transmission line network 121 may be any one of the transmission line networks 110-116 described with reference to FIGS. 2A and 2B. Further, the two external terminals 114 may be any one of external terminal pairs 104a,b, 104d,e, and 104g, h.

The π-filter 122 comprises a first inductor 124, a second inductor 126 and a capacitor 128. The first inductor 124 is coupled between one external terminal 104 and the first transmission line 121a such that a first side (or terminal) of the first inductor 124 is coupled to the one external terminal 104 and a second side of the first inductor 124 is coupled to the first transmission line 121a. The second inductor 124 is coupled between another terminal 104 and the second transmission line 121b. The capacitor is coupled between the first transmission line 121a and the second transmission line 121b.

As described herein, the capacitive load induced by the proximity and size of the pair of external terminals 104 affects the differential signal traversing the pair of external terminals 104. The capacitive load introduces return loss in the transmission path. The π-filter 122 tunes return loss to be within a desired range of a return loss. For example, the π-filter 122 may tune the return loss to be within a range acceptable by an industry standard, such as the International Organization for Standardization (ISO) and the International Electrotechnical Commission (IEC) (ISO/IEC) Category 8 standard. The inductors 124, 126 and the capacitor 128 of the π-filter 122 may preferably be discrete elements rather than transmission lines that have inductive and capacitive properties used to respectively model inductors and a capacitor.

Use of discrete components advantageously results in reducing the size of the printed circuit board 102 because the discrete components have a smaller footprint and occupy a smaller area on the printed circuit board 102 than transmission line-based models of the components. In some circumstances, the plug 100 may be sought to be relatively compact and have a relatively small size or footprint. The size constraints of the plug 100 may limit the area available for transmission lines on the printed circuit board 102. Under the size constraints, there may not be an area on the printed circuit board 102 that is large enough to fit the transmission lines used to model filter components.

Further, in a testing or lab environment, where the response of the filter is tested and configured, use of discrete components allows for swapping the inductors 124, 126 and the capacitor 128 to achieve a filter response without needing to reconfigure the printed circuit board 102 or transmission lines thereof.

The π-filter 122 may be advantageously placed within a minimum distance of the pair of external terminals 104. For example, the terminals of the inductors 124, 126 may be within a maximum distance of 2.5 millimeters (mm) from the conductive slots of the external terminals 104. In the event that a 14 dB limit is imposed on return loss at a 2 Ghz signal frequency, the maximum distance may be 1 mm.

Such placement improves return loss tuning as the propagation delay due to path length between the pair of external terminals 104 and the π-filter 122 degrades the performance of return loss tuning.

In a lower frequency range (e.g., below 944 Megahertz (MHz)), the inductors 124, 126 compensate for the capacitive load caused by the pair of external terminals 104. This results in reducing the return loss to an acceptable range of return loss. The interaction between the capacitor 128 and inductors 124, 126 of the π-filter 122 may introduce a null in the range of frequency below 1800 MHz range allowing the plug 100 to meet a 14 decibel (dB) high frequency limit. Further, in a broadband application (1-2 gigahertz (GHz)), use of the π-filter 122 tunes the return loss to be within the range of return loss across the broadband frequency range.

As described herein, due to the size profile of the external terminals 104, the return loss may be significant and relatively large. Further, at higher signal frequencies (for example, signal frequencies near 2 GHz), the return loss is exacerbated and becomes more significant. Further, with the presence of the return loss, the plug may fail to satisfy return loss cabling requirements (such as the requirements of the ISO/IEC Category 8 standard). Use of the π-filter 122 tunes the return loss to a desired range (for example, a range compliant with a standard, such as the ISO/IEC Category 8 standard). When implemented using discrete components, the π-filter 122 tunes the return loss while only utilizing a small footprint.

In conventional plugs that do not utilize the π-filter 122, tuning the return loss negatively impacts crosstalk. For example, tuning the return loss for one pair of external terminals 104 carrying a differentially transmitted signal will introduce crosstalk in the signal. The π-filter 122, however, largely decouples return loss tuning from the induction of crosstalk. While tuning for return loss, the π-filter 122 does not result in the induction of considerable crosstalk in the differential signal. The π-filter 122 tunes return loss while inducing only a relatively small amount of crosstalk or negligible crosstalk. Use of the π-filter 122 largely decouples return loss tuning from crosstalk tuning such that return loss tuning only negligibly affects crosstalk. The return loss may be independently (or substantially independently) tuned without affecting the crosstalk and vice-versa.

In conventional techniques, return loss tuning and crosstalk tuning are interdependent. Tuning one type of interference adversely impacts the other type of interference. For example, in the conventional techniques, tuning the return loss affects the crosstalk and results in inducing crosstalk. The induced crosstalk will be required to be tuned, which will, in turn, induce return loss. Therefore, in conventional techniques, a circular approach is often followed, whereby tuning a first type of interference impacts a second type of interference, which will, in turn, requires further tuning of its own.

Use of the π-filter 122 is advantageous in that the crosstalk tuning and return loss tuning become decoupled. The crosstalk and the return loss may are independently (or substantially independently) tuned.

To that end, it may be desirable to induce crosstalk in the differentially transmitted signal. Both a phase and a magnitude of the crosstalk may be tuned to be within a respective range of crosstalk phases and magnitudes. It may be desired for the plug 100 to induce crosstalk having a phase and a magnitude within the respective desired range of crosstalk phases and magnitudes. As described herein, the plug 100 may be mated with a jack using the plurality of external terminals 104 as a contact block. Certain interoperability specifications, such as the ISO/IEC Technical Report 11801-99-1 (ISO/IEC TR 11801-99-1), place requirements on the return loss and crosstalk performance of compliant plugs and jacks. To be compliant with the interoperability specification, the plug 100 may be required to induce crosstalk having a certain phase and magnitude or ranges thereof. The jack may, conversely, be required to compensate for the crosstalk induced by the plug.

Referring now to FIGS. 2A and 2B, use of the transmission line networks 112, 114 in tuning the magnitude and phase of crosstalk is described. The third and sixth external terminals 104*c*, 104*f* in operation carry a differential signal. Furthermore, the fourth and fifth external terminals 104*d*, 104*e* also carry a differential signal.

Crosstalk having a certain magnitude may be induced in the differential signal traversing the fourth and fifth external terminals 104*d*, 104*e* (and third transmission line network 114). To increase the crosstalk magnitude, the first portion 112*a* of the second transmission line network 112 runs on the printed circuit board 102 within a distance of the third transmission line network 114. The relationship between the crosstalk magnitude and the distance is inversely proportional. The shorter the distance between the second transmission line network 112 and the third transmission line network 114 the larger will be the crosstalk magnitude induced in the third transmission line network 114.

As shown in FIG. 2A, the two transmission lines of the first portion 112*a* of the second transmission line network 112 are split and surround their respective counterparts of the third transmission line network 114 for a length 130 of the second transmission line network 112. Thereafter, the vias 120*a*, 120*b* are reached and the second portion 112*b* of the second transmission line network 112 traverses a path on the bottom side of the printed circuit board 102. The third transmission line network 114 remains on the opposite side (top) of the printed circuit board 102. While on opposite sides of the printed circuit board 102 minimal or no crosstalk is induced. Once crosstalk tuning has been accomplished, the second and third transmission line networks 112, 114 are diverted away from one another. Thereafter, the second and third transmission line networks 112, 114 are not within a proximity of one another so as to tune the crosstalk. The proximity between respective transmission lines of the second and third transmission line networks 112, 114 over the length 130 of the transmission line networks 112, 114 tunes the magnitude of the crosstalk.

The phase of the induced crosstalk is proportional to the length 130 over which the second and third transmission line networks 112, 114 are within proximity of each other. The longer the second and third transmission line networks 112, 114 run within a proximity of each other, the larger will be the phase of the crosstalk. As shown in the figures, the second and third transmission line networks 112, 114 run within a proximity of one another for the length 130 of the transmission line networks 112, 114 to induce crosstalk having a desired phase.

The plug 100 may optionally include a plurality of termination elements 132*a-d* (singularly referred to herein as a termination element 132). The plurality of termination elements 132*a-d* include a first termination element 132*a*, a second termination element 132*b*, a third termination element 132*c* and a fourth termination element 132*d*.

Each termination element 132 of the plurality of termination elements 132*a-d* includes a respective pair of soldering pads 134, 136. Each termination element 132 of the plurality of termination elements 132*a-d* is coupled to a respective transmission line network of the plurality of transmission line networks 110-116.

Each termination element 132 may be used to measure return loss performance in a testing or lab environment. Performing return loss measurement using the termination element 132 is more accurate than performing the return loss measurement using other techniques. For example, absent the termination element 132, performing return loss measurement would require coupling the internal terminals 104 of the plug to a trimmed cable and measuring return loss at the trimmed ends of the cable. However, such measurement may not accurately convey the return loss performance of the plug 200 because it includes the return loss induced by the cable as well as the plug 200.

For example, to perform a return loss measurement on the differential signal carried by the first transmission line network 110 using the first termination element 132*a*, a first side of a resistor (such a 50 Ohm (Ω) resistor (not shown)) may be soldered to the first soldering pad 134*a*. The second soldering pad 136*a* may be connected to ground. The second side of the resistor may be coupled to a measurement device to measure the return loss in the differential signal carried by the first transmission line network 110.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus, comprising:
   a printed circuit board;
   a plurality of external terminals at a first end of the printed circuit board; and
   a plurality of internal terminals at a second end of the printed circuit board, the printed circuit board including a filter coupled to a first external terminal and a second external terminal of the plurality of external terminals, the filter including a first inductor coupled between the first external terminal and a first side of a capacitor, and a second inductor coupled between the second external terminal and a second side of the capacitor, the filter being operative to tune return loss caused by the first and second external terminals and help compensate for a capacitive load induced by sizes of and a proximity between the first and second external terminals.

2. The apparatus of claim 1, wherein the printed circuit board further includes a first transmission line network including a first transmission line and a second transmission line, the first transmission line being coupled between the first side of the capacitor and a first internal terminal and the second transmission line being coupled between the second side of the capacitor and a second internal terminal, each of the first and second transmission lines being located on the printed circuit board within a distance of a second transmission line network to tune a magnitude of crosstalk between the first transmission line network and the second transmission line network to a desired range of crosstalk magnitudes, the first and second transmission lines being located within the distance of the second transmission line network over respective first and second portions of their lengths to tune a phase of the crosstalk to be within a desired limit of crosstalk phase.

3. The apparatus of claim 2, wherein:
the second transmission line network comprises a third transmission line and a fourth transmission line;
the first transmission line runs on the printed circuit board over the respective first portion of its length within a first distance of the third transmission line; and
the second transmission line runs on the printed circuit board over the respective second portion of its length within a second distance of the fourth transmission line.

4. The apparatus of claim 2, wherein the magnitude of crosstalk tuned by the first transmission line network and the second transmission line network is proportional to the distance of the first transmission line network to the second transmission line network.

5. The apparatus of claim 2, wherein the first and second transmission lines are diverted away from the second transmission line network subsequent to the respective first and second portions of the lengths of the first and second transmission lines to cease tuning the magnitude of the crosstalk and the phase of the crosstalk.

6. The apparatus of claim 1, wherein the first inductor and second inductor are discrete inductors and the capacitor is a discrete capacitor.

7. The apparatus of claim 1, wherein the filter is operative to decouple tuning the return loss from tuning the magnitude of the crosstalk and the phase of the crosstalk such that the return loss is tuned with minimal impact on the magnitude of the crosstalk and the phase of the crosstalk.

8. The apparatus of claim 1, wherein the filter is coupled within a distance of 2.5 millimeters (mm) to the first external terminal and the second external terminal.

9. The apparatus of claim 1, wherein the plurality of external terminals form a contact block operable to connect the apparatus to a jack, and wherein the plurality of internal terminals are operable to connect the apparatus to a cable.

10. An apparatus, comprising:
a plurality of external terminals;
a plurality of internal terminals; and
a filter coupled to a first external terminal and a second external terminal of the plurality of external terminals, the filter including a first inductor coupled between the first external terminal and a first side of a capacitor, and a second inductor coupled between the second external terminal and a second side of the capacitor, the filter being operative to tune return loss caused by the first and second external terminals and help compensate for a capacitive load induced by sizes of and a proximity between the first and second external terminals.

11. The apparatus of claim 10, further comprising:
a first transmission line network including a first transmission line and a second transmission line, the first transmission line being coupled between the first side of the capacitor and a first internal terminal and the second transmission line being coupled between the second side of the capacitor and a second internal terminal, each of the first and second transmission lines being located on the printed circuit board within a distance of a second transmission line network to tune a magnitude of crosstalk between the first transmission line network and the second transmission line network to a desired range of crosstalk magnitudes, the first and second transmission lines being located within the distance of the second transmission line network over respective first and second portions of their lengths to tune a phase of the crosstalk to be within a desired limit of crosstalk phase.

12. The apparatus of claim 11, wherein the magnitude of crosstalk tuned by the first transmission line network and the second transmission line network is proportional to the distance of the first transmission line network to the second transmission line network.

13. The apparatus of claim 10, wherein the first inductor and second inductor are discrete inductors and the capacitor is a discrete capacitor.

14. The apparatus of claim 10, wherein the filter is operative to decouple tuning the return loss from tuning the magnitude of the crosstalk and the phase of the crosstalk such that the return loss is tuned with minimal impact on the magnitude of the crosstalk and the phase of the crosstalk.

15. The apparatus of claim 10, wherein the filter is coupled within a distance of 2.5 millimeters (mm) to the first external terminal and the second external terminal.

16. A method comprising:
tuning, by a filter, return loss caused by a first external terminal and a second external terminal to compensate for a capacitive load induced by sizes of and a proximity between the first and second external terminals, the filter being coupled to the first external terminal and the second external terminal, the filter including a first inductor coupled between the first external terminal and a first side of a capacitor, and a second inductor coupled between the second external terminal and a second side of the capacitor; and
decoupling, using the filter, the tuning of the return loss from tuning a magnitude and a phase of a crosstalk between a first transmission line network and a second transmission line network such that the return loss is tuned with minimal impact on the crosstalk, the first transmission line network including a first transmission line and a second transmission line, the first transmission line being coupled between the first side of the capacitor and a first internal terminal and the second transmission line being coupled between the second side of the capacitor and a second internal terminal.

17. The method of claim 16, further comprising:
tuning, by the first transmission line network, the magnitude of crosstalk induced in the second transmission line network to a desired range of crosstalk magnitudes, each of the first and second transmission lines being within a distance of the second transmission line network to tune the magnitude of the crosstalk to the desired range of crosstalk magnitudes; and
tuning, by the first transmission line network, the phase of the crosstalk induced in the second transmission line network to be within a desired limit of crosstalk phase, the first and second transmission lines being located within the distance of the second transmission line network over respective first and second portions of their lengths to tune the phase of the crosstalk to be within the desired limit of crosstalk phase.

18. The method of claim 16, wherein:
the second transmission line network comprises a third transmission line and a fourth transmission line;
the first transmission line runs over the respective first portion of its length within a first distance of the third transmission line; and
the second transmission line runs over the respective second portion of its length within a second distance of the fourth transmission line.

19. The method of claim 16, wherein the first inductor and second inductor are discrete inductors and the capacitor is a discrete capacitor.

* * * * *